United States Patent
Fastner et al.

(10) Patent No.: US 11,506,694 B1
(45) Date of Patent: Nov. 22, 2022

(54) BROADBAND VECTOR NETWORK ANALYZER WITH CASCADED REFLECTOMETERS

(71) Applicant: Rohde & Schwarz GmbH & Co. KG, Munich (DE)

(72) Inventors: Tobias Fastner, Munich (DE); Christoph Hammerschmidt, Munich (DE); Ashwin Venkatram, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 0 days.

(21) Appl. No.: 17/314,944

(22) Filed: May 7, 2021

(51) Int. Cl.
  *G01R 27/06* (2006.01)
  *G01R 27/28* (2006.01)

(52) U.S. Cl.
  CPC ............. *G01R 27/06* (2013.01); *G01R 27/28* (2013.01)

(58) Field of Classification Search
  CPC ................................. G01R 27/06; G01R 27/28
  See application file for complete search history.

(56) References Cited

U.S. PATENT DOCUMENTS

| | | | | |
|---|---|---|---|---|
| 7,019,510 B1* | 3/2006 | Bradley | ................. | G01R 27/04 324/76.23 |
| 7,683,633 B2 | 3/2010 | Noujeim | | |
| 8,278,944 B1* | 10/2012 | Noujeim | ................. | G01R 27/04 324/637 |
| 8,392,495 B2 | 3/2013 | Morgan | | |
| 2005/0258815 A1* | 11/2005 | Shoulders | .............. | G01R 27/28 324/76.23 |
| 2011/0304318 A1* | 12/2011 | Noujeim | ............ | G01R 31/2841 324/76.24 |
| 2016/0306000 A1* | 10/2016 | Whitlock | ............. | H05K 9/0069 |

* cited by examiner

*Primary Examiner* — Akm Zakaria
(74) *Attorney, Agent, or Firm* — Christensen O'Connor Johnson Kindness PLLC (57) ABSTRACT

A vector network analyzer configured to analyze a high-frequency signal received is described. The vector network analyzer includes three or more reflectometers, each reflectometer operating at a respective frequency range and having a first terminal and a second terminal. The reflectometers are connected with each other in series such that a combined frequency range of the vector network analyzer is established. A first reflectometer is connected to one of a load or a signal source via its first terminal. A last reflectometer is connected to a test port via its second terminal. At least two reflectometers are interconnected with each other by an interposed frequency selective absorptive filter.

20 Claims, 4 Drawing Sheets

BROADBAND VECTOR NETWORK ANALYZER WITH CASCADED REFLECTOMETERS

FIELD OF THE DISCLOSURE

Embodiments of the present disclosure generally relate to a vector network analyzer.

BACKGROUND

Electronic devices usually have to be tested with regard to their signal characteristics, for example in high frequency applications. Disturbances with regard to the signal quality may arise from crosstalk between different ports of such electronic devices thereby lowering the overall signal quality. For instance, a device having two ports, an input-port and an output-port, may be tested in view of its scattering parameters (S-parameters). These describe the electrical behavior of the respective device when undergoing various steady state stimuli. A port matching measurement of the device under test can then be performed once the scattering parameters are determined.

It is known to use vector network analyzers (VNAs) having two reflectometers for testing the device under test. The reflectometers have different passband frequency bandwidths (in band signal portions) in order to provide a combined frequency range of the vector network analyzer. Then, the device under test may be investigated with regard to its electronic properties within the entire combined frequency range using a single test instrument omitting the need to apply several different test instruments. However, the reflectometers may at least partially cause disturbances in the respective out of band frequency ranges for each respective reflectometer. These disturbances lower the overall signal quality.

It is known to arrange a diplexer between the reflectometers in order to absorb at least part of the out of band signal portions, namely the signal portions which do not correspond to the passband frequency range of the respective reflectometer. The diplexer may comprise several filters with complementary susceptance curves. This approach requires a large number of distinct elements, more than a conventional filter of the same order would need. Further, the diplexer is matched on only one of two ports associated with the two reflectometers. This means that the diplexer is configured to absorb disturbances with regard to only one of the forward or backward propagation directions of the signal.

Accordingly, there is need for a vector network analyzer showing improved signal properties, also in view of both the forward and the backward propagation direction of the signal.

SUMMARY

The subject matter of the independent claims satisfies the respective need or others. Further embodiments are indicated within the dependent claims and the following description, each of which, individually or in combination, may represent aspects of the disclosure.

A summary of certain embodiments disclosed herein is set forth below. It should be understood that these aspects are presented merely to provide a brief summary of these embodiments and that these aspects are not intended to limit the scope of this disclosure. This disclosure may encompass a variety of aspects that may not be set forth below.

Embodiments of the present disclosure relate to a vector network analyzer (VNA) configured to analyze a high-frequency (HF) signal received. In an embodiment, the VNA comprises three or more reflectometers. Each reflectometer operates at a respective frequency range. Each reflectometer has a first terminal and a second terminal. The reflectometers are connected with each other in series, thereby establishing a chain of reflectometers, such that a combined frequency range of the VNA is established. A first reflectometer of the chain of reflectometers is connected to one of a load or a signal source via its first terminal. A last reflectometer of the chain of reflectometers is connected to a test port via its second terminal. At least two reflectometers are interconnected with each other by an interposed frequency selective absorptive filter.

Generally, the signal performance of the VNA depends at least in part on reflected signal portions. As the three or more reflectometers are connected with each other in series, the reflectometers correspond to chained reflectometers that may have different passband bandwidths (also called frequency ranges). The reflected signal portions may be caused by reflectometers having lower or at least different passband ranges compared to neighbored reflectometers. In this regard, the frequency range of the interposed absorptive filter may be tailored according to the adjacent reflectometers. Then, any reflections with regard to the adjacent reflectometers can be prevented by the filter as the corresponding reflected signal portions are absorbed. Accordingly, a reflection-free filter is provided which may be considered as a filter that, given ideal components, has a reflection coefficient identically zero at all ports. The function of the interposed frequency selective absorptive filter is to absorb the stop-band portions of the signal spectrum rather than reflecting it back. Put differently, forward as well as backward reflections of the high-frequency (HF) signal may be avoided by interposing the absorptive filter if the frequency of its absorption frequency range(s) is (are) appropriately adjusted in view of the respective signal propagation direction. This means that the interposed frequency selective absorptive filter shows a two-directional absorptive behavior.

The frequency range for which the filter absorbs signal portions may be tailored by including at least one of an inductance, a resistor, and a capacitor, or any combination thereof. Accordingly, the filter may be tailored according to the needs in view of the adjacent reflectometers. Therefore, the filter may be specialized showing corresponding narrowband absorptive properties.

Tailoring the filter according to the adjacent reflectometers offers the possibility to design the reflectometers in view of the desired passband performances only. Any design constraints as to possible reflected signal portions may be neglected if reflection-free filters are included in the VNA. Once the signal properties of the reflectometers are known, the filter may then be appropriately adjusted to absorb any out of band signal portions. The passband bandwidth signal portions may remain undisturbed though the filter is present. In this regard, out of band refers to the non-passband(s) signal portions of the reflectometers. As a consequence, the overall signal performance of the VNA may be high.

The VNA may be configured to determine at least one scattering parameter associated with a device under test (DUT). The DUT may be coupled to the second terminal of the last reflectometer. Since the DUT may generally have any number of (analogue) ports, for example the input port and the output port, the DUT may correspond to a two-port device. However, the DUT may also correspond to a three-port device, a four-port device and any high-order port having more than four ports. Therefore, the scattering parameters may correspond to two-port scattering parameters (2-port S-parameters) that describe generally the input port reflection coefficient ($S_{11}$), the reverse gain ($S_{12}$), the forward gain ($S_{21}$), and the output port reflection coefficient ($S_{22}$). The VNA may determine at least one of these scattering parameters.

In other words, the VNA may be configured to determine a scattering parameter of a DUT coupled to the second terminal of the last reflectometer based on a wideband modulated signal emitted by a signal source coupled to the first terminal of the first reflectometer. This means a wideband modulated signal is used for determining at least one scattering parameter of the device under test (port matching measurement). The signal source could for instance be a vector signal generator. The VNA may then determine the scattering parameters of the DUT based on a comparison between the measured signal components in both propagation directions.

In addition or as an alternative, at least one reflectometer may be selectively detachable from each other. Hence, the series of reflectometers may be altered by detaching a specific reflectometer. Therefore, the combined frequency range of the VNA may be adapted with regard to an additional degree of freedom. In other words, the order of the reflectometers within the chain of reflectometers may be changed. Accordingly, the customer may influence the combined frequency range. This may be advantageous, if an investigation of the DUT is desired only with regard to a limited frequency range for instance. Then, scattering parameters of a DUT may be determined at higher precision.

According to a further aspect, the present disclosure relates to a VNA. In an embodiment, the VNA comprises a first reflectometer operating at a first frequency range. The first reflectometer has a first terminal connected to a test port and a second terminal. The VNA also comprises a second reflectometer operating at a second frequency range. The second frequency range is lower than the first frequency range. The second reflectometer has a first terminal and a second terminal. The VNA further comprises an absorptive frequency selective filter that is connected to the first terminal of the second reflectometer and the second terminal of the first reflectometer. The absorptive frequency selective filter absorbs signal portions having a frequency outside the second frequency range (out of band signal portions), namely the one of the second reflectometer. In some embodiments, the signal portions are absorbed in relation to the neighboring reflectometer, e.g., the downstream located reflectometer. This means, signal portions outside the passband bandwidth of the second reflectometer, namely its frequency range, are absorbed by the absorptive frequency selective filter. In other words, the passband bandwidth of each cascaded reflectometer may remain undisturbed in presence of the absorptive frequency filter.

As an example, the passband bandwidth of the first reflectometer may comprise out of band signal portions of the adjacent second reflectometer. However, these signal portions are absorbed by the absorptive frequency selective filter before they are received by the second reflectometer that is located downstream with respect to the first reflectometer. If the passband bandwidth partially overlap, the absorptive behavior extends to the respective non-overlapping portions. Since these signal portions are absorbed by the absorptive filter, the purity of the combined HF signal is improved.

According to a third aspect, the present disclosure relates to a VNA. In some embodiments, the VNA comprises a first reflectometer operating at a first frequency range. The first reflectometer has a first terminal connected to a test port and a second terminal. The VNA also comprises a second reflectometer operating at a second frequency range. The second frequency range is higher than the first frequency range. The second reflectometer has a first terminal and a second terminal. The VNA further comprises an absorptive frequency selective filter connected to the first terminal of the second reflectometer and the second terminal of the first reflectometer. The absorptive frequency selective filter absorbs signal portions having a frequency outside the second frequency range, namely the passband bandwidth of the second reflectometer, which is the subsequent reflectometer. Similar as for the second aspect of the present disclosure, the filter absorbs out of band signal portions with regard to the second reflectometer in view of the passband bandwidth of the second reflectometer. Accordingly, the quality of the combined HF signal is improved. In some embodiments, disturbances are avoided.

Moreover, each reflectometer may have a source port, a reference receiver, and a reflected wave receiver. The source port may be configured to be coupled to a signal source for providing a reference signal. The reference receiver may be configured to detect a so-called a-wave propagating in a first direction, for example the forward direction. The reflected wave receiver may be configured to detect a so-called b-wave propagating into a second opposite direction, for example the reflected wave direction, also called reverse direction. Based on the source port, the reference receiver, and the reflected wave receiver different scattering parameters of a device under test may be determined with regard to the passband frequency range of the reflectometer. Determination of the scattering parameters may rely on a comparison between the forward and backward propagating signals detected by the reference receiver and the reflected wave receiver.

At least one of or all reflectometers may either be coupler-based or resistive bridge-based reflectometers. Accordingly, the reflectometers and the included receivers and ports may be adapted to the desired architecture used for the VNA which may depend on the specific frequency ranges. In some embodiments, the first reflectometer may comprise a reflection bridge layout. Subsequent reflectometers may be coupler-based.

According to an example, frequency selective absorptive filters may be interconnected between each pair of adjacently located reflectometers. In this case, the filters may be appropriately adapted to the adjacent reflectometers. Accordingly, reflected signal portions may be absorbed between each pair of reflectometers. Thereby, the signal quality is further improved.

In some embodiments, the VNA may comprise a housing. At least one of the reflectometers may then be located externally with respect to the housing. Accordingly, the customer may connect at least one different reflectometer in order to include it into the series of reflectometers, namely the chain of reflectometers. This is particular advantageous since the customer may then select and implement at least one specific reflectometer to establish a desired combined frequency range of the VNA. Scattering parameters of a device under test may be more precisely determined according to the respective needs.

The respective frequency ranges of the reflectometers may be different from each other. As there does not need to be any overlap between the frequency ranges of the reflectometers, the combined frequency range of the VNA may be enlarged. However, in an alternative, the passband ranges of the reflectometers may at least partially overlap each other.

The combined frequency range may be between 1 MHz and 100 GHz. Signals having frequencies within this range are called high frequency (HF) signals throughout this disclosure. High frequency applications are used in manifold applications nowadays. Accordingly, DUTs may be investigated with regard to their signal properties and performances by the so-designed VNA.

The reflectometers, for example the first and second reflectometers, together may establish a combined frequency range of the vector network analyzer. Therefore, the overall frequency range of the VNA may be larger compared to the individual frequency ranges (passband bandwidths) if the respective reflectometer. A DUT may then be investigated with regard to the enlarged combined frequency range with a signal device omitting the need of multiple separate devices.

Each reflectometer comprises a first terminal and an opposite second terminal. In this regard, all first terminals of any reflectometer may be configured to be coupled to a load or a signal source. Moreover, all second terminals of any reflectometer may be configured to be coupled to a test port. For example, the test port could be used for connecting a device under test. In addition, the terminals are also configured to be coupled to different reflectometers or to filters. Accordingly, a series connection of the reflectometers may be established, namely the chain of reflectometers.

The advantages of the present disclosure are manifold. Using a reflection-free filter, instead of a diplexer for instance, improves the S11 and the S22 measurements because the a-wave has a smaller contribution from the reflection coming from the low-frequency reflectometer. Spoken differently, the reflection-free filter provides a lower insertion loss at higher frequencies. Therefore, the source match, the load match for the HF reflectometers, and the harmonics of the lower band radiometer bridge are improved. Consequently, the output power may be increased.

Reflection-free filters provide broadband match and good return loss across the designed frequency of operation. Such filters enable easy cascading of HF reflectometers at any frequencies. Accordingly, the VNA may be manufactured at reduced costs but simultaneously showing improved performance. Moreover, the reflection-free filters separate the adjacent reflectometers due to the absorption of unwanted signal portions. Hence, the VNA may comprise a segmented frequency plan with individually specialized components showing improved narrowband characteristics. The filters also lower the measurement uncertainty. In some embodiments when measuring highly reflective DUTs, the reflections between adjacent reflectometers are absorbed, thereby improving the signal properties and the precision of the determination of the scattering parameters.

All features and embodiments disclosed with respect to the first, second, or third aspect of the present disclosure are combinable alone or in (sub-)combination with any one of the aspects of the present disclosure including any or each of the embodiments thereof.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed. Various modifications to the described embodiments will be readily apparent to those skilled in the art, and the general principles defined herein may be applied to other embodiments and applications without departing from the spirit and scope of the described embodiments.

Similarly, any steps described herein may be interchangeable with other steps, or combinations of steps, in order to achieve the same or substantially similar result. Moreover, some of the method steps can be carried serially or in parallel, or in any order unless specifically expressed or understood in the context of other method steps.

In the foregoing description, specific details are set forth to provide a thorough understanding of exemplary embodiments of the present disclosure. It will be apparent to one skilled in the art, however, that the embodiments disclosed herein may be practiced without embodying all of the specific details. In some instances, well-known process steps have not been described in detail in order not to unnecessarily obscure various aspects of the present disclosure. Further, it will be appreciated that embodiments of the present disclosure may employ any combination of features described herein.

Figure 1:
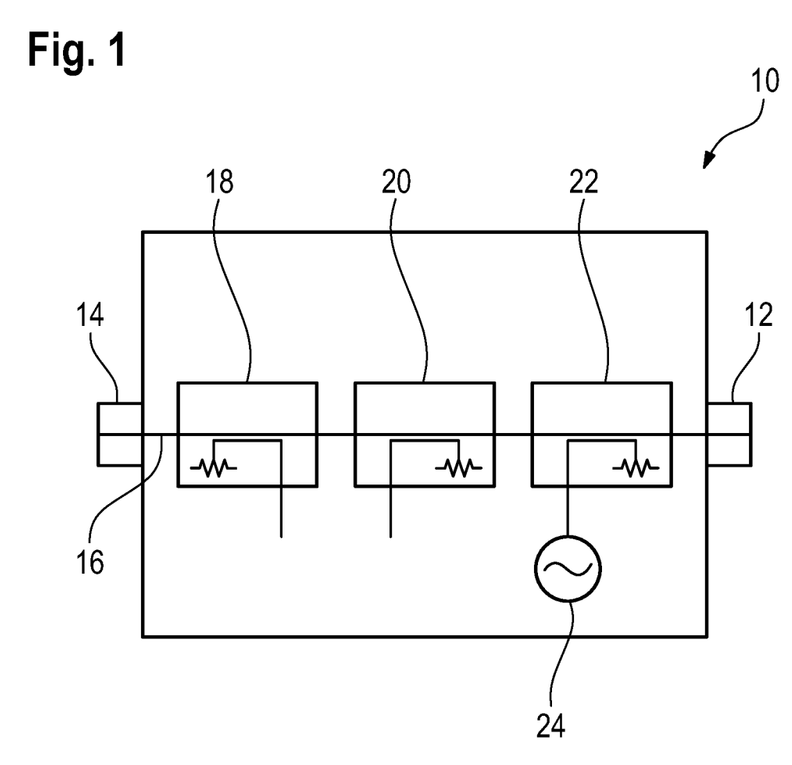
FIG. 1 is a schematic drawing of a representative reflectometer.

FIG. 1 is a schematic drawing of a reflectometer 10 that can be used in a vector network analyzer (VNA), for example its front end. In the embodiment shown, the reflectometer 10 comprises a first terminal 12 and a second terminal 14. Via the first and the second terminals 12, 14, the reflectometer 10 may be coupled to external components. In some embodiments, the first terminal 12 may be configured to be coupled to at least one of a signal source or a load and the second terminal 14 may be configured to be coupled to a test port, or vice versa. At the test port, a device under test may be connected.

Between the first and the second terminals 12, 14, the reflectometer 10 may comprise a conductor or line 16. The conductor or line 16 may specifically be configured for transmitting high frequency (HF) signals.

The reflectometer 10 also comprises a reflected wave receiver 18, a reference receiver 20, and a source port 22. Via the source port 22, the reflectometer 10 may be coupled to a signal source 24, for example an integrated signal source 24. The reflectometer 10 may detect a HF signal in the forward direction (a-wave) by the reference receiver 20.

Moreover, the reflectometer 10 may also detect a HF signal in the backward direction (reflected wave direction; b-wave) by the reflected wave receiver 18.

The HF signals detected in forward as well as in the reflected wave direction generally depend on external components connected to the reflectometer 10. If a device under test (DUT) is coupled to the second terminal 14, the intrinsic electronic properties of the DUT will alter the signal characteristics in both propagation directions at the reflectometer 10. Based on a comparison between the detected signals and the reference signal detected at the source port 22 the scattering parameters of the DUT may be determined.

For example, for a two-port DUT (input and output) the scattering parameters S11, S12, S21, and S22 may be determined. Afterwards, port matching may be applied to optimize the electronic properties of the DUT.

The reflectometer 10 may be configured according to a specific passband bandwidth. In some embodiments, at least one or generally all of the reflected wave receiver 18, the reference receiver 20, and the source port 22 may be configured in view to a specific passband frequency bandwidth (also called frequency range). Signal portions of the source signal and detection signals having frequencies within the passband bandwidth are called in band signal portions. Determination of the scattering parameters is at least primarily or exclusively based on in band signal portions. In contrast, out of band portions are desired to be avoided since they negatively affect determination of the scattering parameters. This also means that each reflectometer 10 evaluates the detected signals with regard to its intrinsic passband bandwidth.

Figure 2:
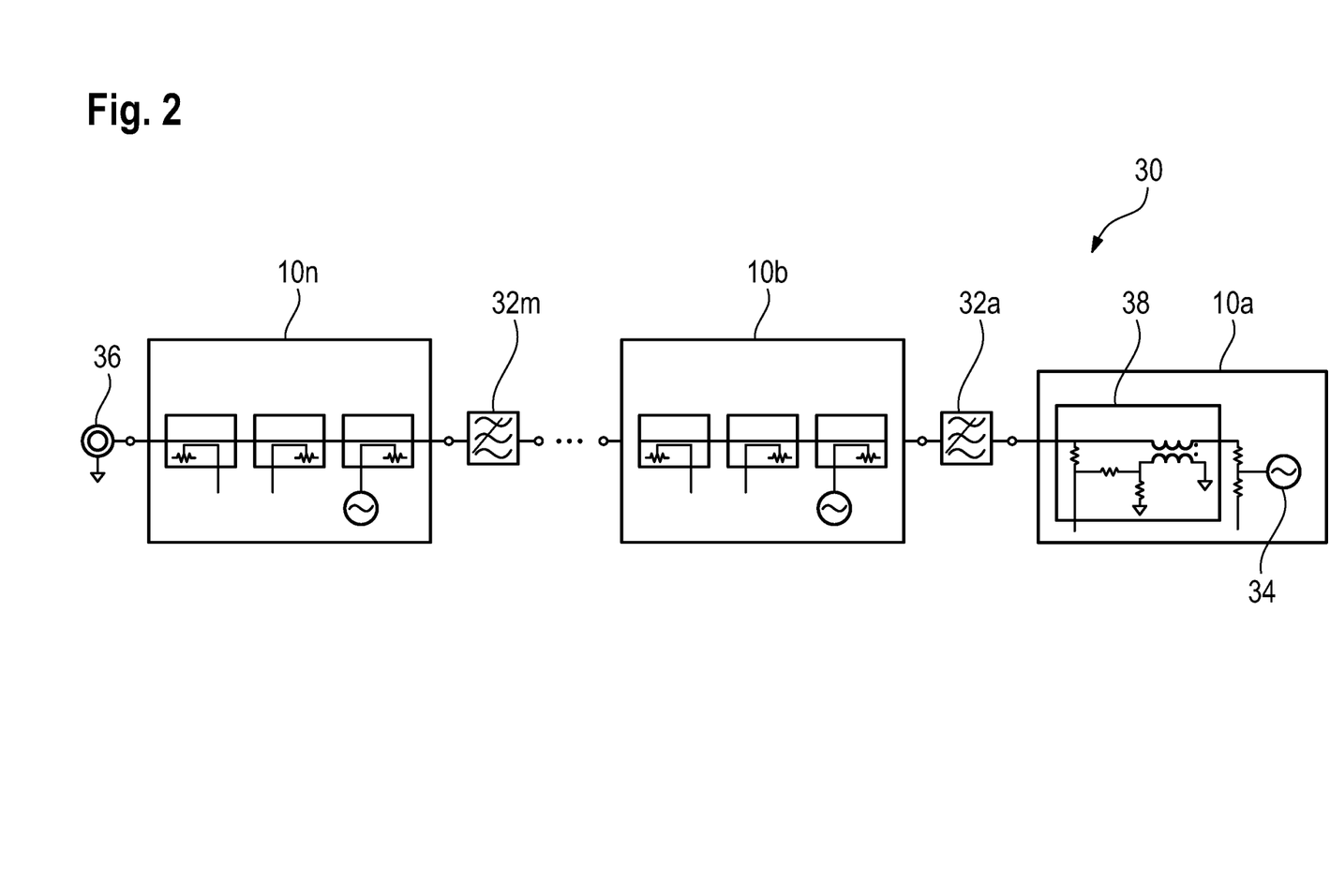
FIG. 2 is a schematic drawing of a part of a vector network analyzer according to an embodiment.

FIG. 2 is a schematic drawing of a part of a vector network analyzer (VNA) 30 according to an embodiment, for instance its front end. Repeated explanation of features already disclosed above has been omitted for brevity and clarity of the disclosure. As shown in FIG. 2, the VNA 30 comprises multiple reflectometers 10a, 10b, . . . , 10n that are connected with each other in series, thereby establishing a chain of reflectometers.

Between adjacent reflectometers 10a, 10b, . . . , 10n, for example between the first reflectometer 10a and the second reflectometer 10b, a frequency selective absorptive filter 32a is arranged. This means that the second terminal of the first reflectometer 10a is coupled to one side (input port) of the filter 32a. The second side of the filter 32a, which is opposite to the first side, is coupled to the first terminal of the second reflectometer 10b.

Likewise, additional filters 32i may be arranged between further adjacent reflectometers 10i, only one of which is shown, i.e., filter 32m, wherein m may correspond to n−1. Therefore, the reflectometers 10i are connected in series with each other having interposed filters 32i arranged in between.

The last reflectometer 10n is coupled at its second terminal to a test port 36. At the test port 36 a device under test (DUT) may be coupled with one of its ports, such as an input or output port.

In some embodiments, while the second and all subsequent reflectometers 10b, . . . , 10n have a coupler based architecture, the first reflectometer 10a has a resistive bridge based architecture. In this regard, the first reflectometer 10a comprises a reflection bridge 38 composed of a network of resistors and coils, e.g., inductance(s). However, this is optional.

The reflectometers 10i generally have different passband bandwidths. For instance, the first reflectometers 10a may have a passband bandwidth of between 100 MHz and 2 GHz. The second reflectometer 10b may have a passband bandwidth of between 1.5 GHz and 15 GHz, and so on. The passband bandwidths generally do not need to overlap each other, though they commonly do.

Consequently, the VNA 30 may comprise a combined frequency range (passband bandwidth) determined by the summed individual passband bandwidths of the reflectometers 10i.

Since the filters 32i have frequency selective absorptive behavior, they represent two-directional reflection-free filters. Accordingly, they are adapted according to the passband bandwidths of the adjacent reflectometers 10i. This means that the filters 32i absorb out of band signal portions of both propagation directions (forward/backward) with regard to the adjacent reflectometers 10i individually.

Accordingly, each reflectometer 10i is applied substantially with in band signal portions. Therefore, the determination of the scattering parameters of the DUT coupled to the test port 36 in view of the specific passband bandwidth of the respective reflectometer 10i and in view of the VNA 30 in general is improved compared to the case if a diplexer would be used instead of the filter 32i. One of the reasons is that a diplexer shows one-directional behavior only. Therefore, each reflectometer would at least partially be applied with out of band signal portions, at least in one of both propagation directions.

Although the present embodiment shows that VNA 30 has three reflectometers 10i, VNA 30 is not restricted in this regard. As mentioned earlier, VNA 30 may also comprise more or less reflectometers 10i, each of which being arranged in a series connection.

Figure 3:
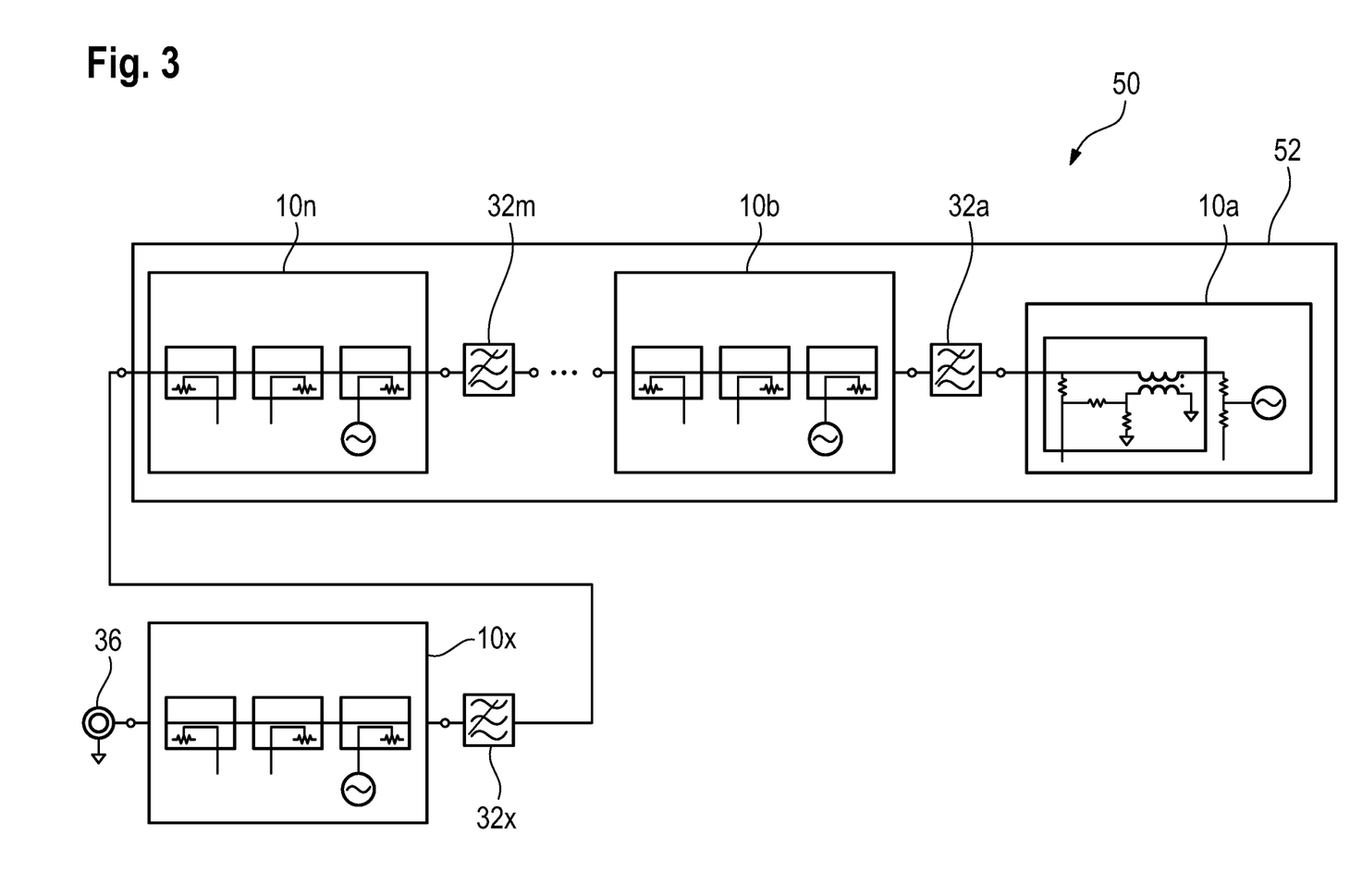
FIG. 3 is a schematic drawing of a part of a vector network analyzer according to another embodiment.

FIG. 3 is a schematic drawing of a part of the VNA 50 according to another embodiment. Repeated explanation of features already disclosed above has been omitted for brevity and clarity of the disclosure. In the embodiment of FIG. 3, the VNA 50 comprises multiple reflectometers 10a, 10b, . . . , 10n generally arranged in series with each other within a housing 52 of VNA 50. In between the reflectometers 10i filters are arranged.

VNA 50 is configured such that the series of reflectometers 10a, 10b, . . . , 10n may be expanded by a customer on his own wishes. The customer may connect an additional external reflectometer 10x serially connected with an additional filter 32x to the second terminal of the last reflectometer 10n of the VNA 50.

The filter 32x may then be adapted with respect to the adjacent last reflectometer 10n and the additional reflectometer 10x. However, the customer may choose the filter 32x and the additional reflectometer 10x accordingly. Still, the functionality of the remaining filters 32a . . . 32m is not influenced although the additional external reflectometer 10x is attached to the existing series. In an alternative or cumulatively, also more than one additional external reflectometer 10x and one external filter 32x may be attached to the VNA 50. In any case, VNA 50 provides the possibility to expand the combined frequency range of VNA 50 according to the customers wishes.

The expansion of the series of the integrated reflectometers of VNA 50, namely the ones within housing 52, is not restricted to the second terminal of the last reflectometer 10n. In an alternative or cumulatively, additional reflectometers 10x and filters 32x may also be connected to the first terminal of the first reflectometer or at another intermediate port.

Generally, the additional external reflectometer 10x serially connected with the additional filter 32x may together be part of a module that can be connected with the VNA 50.

Hence, the module may relate to an extension module used for extending the existing VNA 50.

Figure 4:
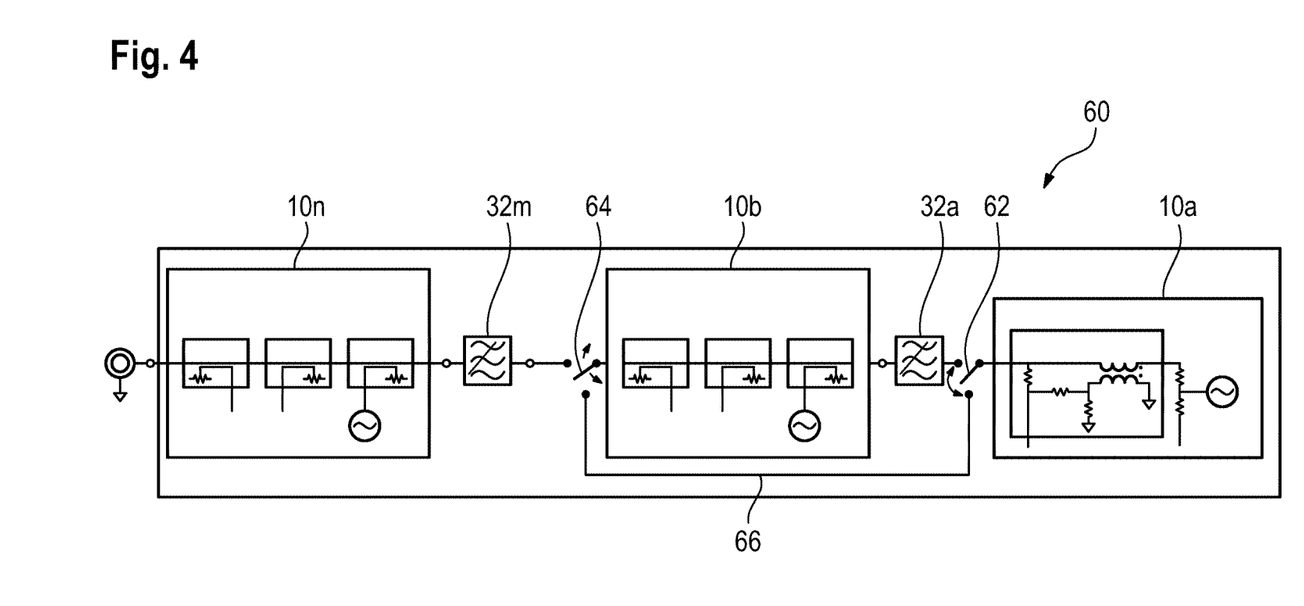
FIG. 4 is a schematic drawing of a part of a vector network analyzer according to an additional embodiment.

FIG. 4 is a schematic drawing of a VNA 60 according to an additional embodiment. Repeated explanation of features already disclosed above has been omitted for brevity and clarity of the disclosure. In the embodiment of FIG. 4, VNA 60 comprises at least a first switch, such as switch module 62 and a second switch, such as switch module 64. Moreover, VNA 60 comprises a bypass 66 coupled between first switch module 62 and second switch module 64. A third switch may be arranged within bypass 66.

Based on the switch modules 62, 64 and bypass 66, the customer may be provided with the possibility to detach at least one reflectometer 10*i*. Accordingly, in a common usage mode of VNA 60, first switch module 62 and second switch module 64 may be closed. In this configuration reflectometer 10*b* is not bypassed. Alternatively, first and second switch modules 62, 64 may be open. In this case, reflectometer 10*b* is bypassed. To ensure correct functionality the operation of the switch modules 62, 64 may depend on each other.

In addition, at least one adjacent filter 32*i* of the bypassed reflectometer 10*i* may be specialized and provide the possibility to be adaptable according to an amended configuration. In this regard, filter 32*i* may provide adjustable components, for instance via an interface that may be used by a service technician or someone else authorized and/or experienced.

The switch modules may accordingly be arranged at different positions within the reflectometer chain, namely the chain of reflectometers 10. Also, multiple reflectometers 10*i* may be bypassable using similar switch arrangements. Hence, the combined frequency range of the VNA 60 may be adjustable.

Optionally, the VNA 60 may also comprise connection ports such that at least one or all reflectometers 10*i* may be usable on an individual basis. Therefore, the flexibility of the VNA 60 is improved. This may be advantageous if the passband bandwidth of a single reflectometer is sufficient for performing the desired tests of the DUT.

Although the disclosure has been illustrated and described with respect to one or more implementations, equivalent alterations and modifications will occur to others skilled in the art upon the reading and understanding of this specification and the annexed drawings. In addition, while a particular feature of the disclosure may have been disclosed with respect to only one of several implementations, such feature may be combined with one or more other features of the other implementations as may be desired and advantageous for any given or particular application.

Certain embodiments disclosed herein utilize circuitry (e.g., one or more circuits) in order to implement protocols, methodologies or technologies disclosed herein, operably couple two or more components, generate information, process information, analyze information, generate signals, encode/decode signals, convert signals, transmit and/or receive signals, control other devices, etc. Circuitry of any type can be used.

In an embodiment, circuitry includes, among other things, one or more computing devices such as a processor (e.g., a microprocessor), a central processing unit (CPU), a digital signal processor (DSP), an application-specific integrated circuit (ASIC), a field-programmable gate array (FPGA), a system on a chip (SoC), or the like, or any combinations thereof, and can include discrete digital or analog circuit elements or electronics, or combinations thereof. In an embodiment, circuitry includes hardware circuit implementations (e.g., implementations in analog circuitry, implementations in digital circuitry, and the like, and combinations thereof).

In an embodiment, circuitry includes combinations of circuits and computer program products having software or firmware instructions stored on one or more computer readable memories that work together to cause a device to perform one or more protocols, methodologies or technologies described herein. In an embodiment, circuitry includes circuits, such as, for example, microprocessors or portions of microprocessor, that require software, firmware, and the like for operation. In an embodiment, circuitry includes an implementation comprising one or more processors or portions thereof and accompanying software, firmware, hardware, and the like.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A and B" is equivalent to "A and/or B" or vice versa, namely "A" alone, "B" alone or "A and B.". Similarly, the phrase "at least one of A, B, and C," for example, means (A), (B), (C), (A and B), (A and C), (B and C), or (A, B, and C), including all further possible permutations when greater than three elements are listed.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The invention claimed is:

1. A vector network analyzer configured to analyze a high-frequency signal received, the vector network analyzer comprising:
   three or more reflectometers, each reflectometer operating at a respective frequency range, each reflectometer having a first terminal and a second terminal,
   wherein the reflectometers are connected with each other in series, thereby establishing a chain of reflectometers, such that a combined frequency range of the vector network analyzer is established,
   wherein a first reflectometer of the chain of reflectometers is connected to one of a load or a signal source via its first terminal,
   wherein a last reflectometer of the chain of reflectometers is connected to a test port via its second terminal, and
   wherein at least two reflectometers are interconnected with each other by an interposed frequency selective absorptive filter, and
   wherein the interposed frequency selective absorptive filter shows a two-directional reflection-free absorptive behavior such that out of band signal portions of a forward and a backward propagation direction of the high-frequency signal are absorbed with regard to passband bandwidths of both reflectometers interconnected by the interposed frequency selective absorptive filter.

2. The vector network analyzer of claim 1, wherein each reflectometer has a source port, a reference receiver, and a reflected wave receiver.

3. The vector network analyzer of claim 1, wherein the reflectometers are either coupler-based or resistive bridge-based reflectometers.

4. The vector network analyzer of claim 1, wherein frequency selective absorptive filters are interconnected between each pair of adjacently located reflectometers.

5. The vector network analyzer of claim 1, wherein the vector network analyzer comprises a housing, and wherein at least one of the reflectometers is located externally with respect to the housing.

6. The vector network analyzer of claim 1, wherein at least one reflectometer is selectively detachable by a switch.

7. The vector network analyzer of claim 1, wherein the respective frequency ranges of the reflectometers are different from each other.

8. The vector network analyzer of claim 1, wherein the vector signal analyzer is configured to determine at least one scattering parameter associated with a device under test.

9. A vector network analyzer comprising:
a first reflectometer operating at a first frequency range, the first reflectometer having a first terminal connected to a test port and a second terminal,
a second reflectometer operating at a second frequency range, the second frequency range being lower than the first frequency range, the second reflectometer having a first terminal and a second terminal, and
an absorptive frequency selective filter connected to the first terminal of the second reflectometer and the second terminal of the first reflectometer, wherein the absorptive frequency selective filter absorbs signal portions having a frequency outside the second frequency range wherein the absorptive frequency selective filter shows a two-directional reflection-free absorptive behavior such that out of band signal portions of a forward and a backward propagation direction of a high-frequency signal are absorbed with regard to passband bandwidths of the first reflectometer and the second reflectometer interconnected by the absorptive frequency selective filter.

10. The vector network analyzer of claim 9, wherein the first and second reflectometers together establish a combined frequency range of the vector network analyzer.

11. The vector network analyzer of claim 9, wherein each reflectometer has a source port, a reference receiver and a reflected wave receiver.

12. The vector network analyzer of claim 9, wherein the reflectometers are either coupler-based or resistive bridge-based reflectometers.

13. The vector network analyzer of claim 9, wherein the frequency ranges of the first and second reflectometers are different from each other.

14. The vector network analyzer of claim 9, wherein the vector network analyzer is configured to determine a scattering parameter of a device under test coupled to the first terminal of the first reflectometer based on a wideband modulated signal emitted by a signal source coupled to the second terminal of the second reflectometer.

15. A vector network analyzer comprising:
a first reflectometer operating at a first frequency range, the first reflectometer having a first terminal connected to a test port and a second terminal,
a second reflectometer operating at a second frequency range, the second frequency range being higher than the first frequency range, the second reflectometer having a first terminal and a second terminal, and
an absorptive frequency selective filter connected to the first terminal of the second reflectometer and the second terminal of the first reflectometer, wherein the absorptive frequency selective filter absorbs signal portions having a frequency outside the second frequency range wherein the absorptive frequency selective filter shows a two-directional reflection-free absorptive behavior such that out of band signal portions of a forward and a backward propagation direction of a high-frequency signal are absorbed with regard to passband bandwidths of the first reflectometer and the second reflectometer interconnected by the absorptive frequency selective filter.

16. The vector network analyzer of claim 15, wherein the first and second reflectometers together establish a combined frequency range of the vector network analyzer.

17. The vector network analyzer of claim 15, wherein each reflectometer has a source port, a reference receiver and a reflected wave receiver.

18. The vector network analyzer of claim 15, wherein the reflectometers are either coupler-based or resistive bridge-based reflectometers.

19. The vector network analyzer of claim 15, wherein the frequency ranges of the first and second reflectometers are different from each other.

20. The vector network analyzer of claim 15, wherein the vector network analyzer is configured to determine a scattering parameter of a device under test coupled to the first terminal of the first reflectometer based on a wideband modulated signal emitted by a signal source coupled to the second terminal of the second reflectometer.

* * * * *

UNITED STATES PATENT AND TRADEMARK OFFICE
CERTIFICATE OF CORRECTION

PATENT NO. : 11,506,694 B1
APPLICATION NO. : 17/314944
DATED : November 22, 2022
INVENTOR(S) : T. Fastner et al.

It is certified that error appears in the above-identified patent and that said Letters Patent is hereby corrected as shown below:

In the Claims

| Column | Line | |
|--------|------|---|
| 11 | 40 | change "range wherein" to -- range, wherein -- |
| 12 | 26 | change "range wherein" to -- range, wherein -- |

Signed and Sealed this
First Day of August, 2023

*Katherine Kelly Vidal*
Katherine Kelly Vidal
*Director of the United States Patent and Trademark Office*